(12) United States Patent
Bahr et al.

(10) Patent No.: US 10,840,883 B2
(45) Date of Patent: *Nov. 17, 2020

(54) INDUCTIVELY-COUPLED MEMS RESONATORS

(71) Applicant: TEXAS INSTRUMENTS INCORPORATED, Dallas, TX (US)

(72) Inventors: Bichoy Bahr, Allen, TX (US); Ting-Ta Yen, San Jose, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/235,382

(22) Filed: Dec. 28, 2018

(65) Prior Publication Data

US 2020/0212881 A1  Jul. 2, 2020

(51) Int. Cl.
*H03H 9/24* (2006.01)
*H03B 5/30* (2006.01)
*H03H 9/02* (2006.01)
*H03H 9/10* (2006.01)
*H01L 23/00* (2006.01)
*H03H 9/00* (2006.01)

(52) U.S. Cl.
CPC .......... *H03H 9/2405* (2013.01); *H01L 24/48* (2013.01); *H03B 5/30* (2013.01); *H03H 9/02244* (2013.01); *H03H 9/02535* (2013.01); *H03H 9/1007* (2013.01); *H01L 2224/48091* (2013.01); *H03B 2200/006* (2013.01); *H03H 2009/0019* (2013.01); *H03H 2009/241* (2013.01)

(58) Field of Classification Search
CPC ........... H03H 9/245; H01L 24/48; H03B 5/30
See application file for complete search history.

(56) References Cited

U.S. PATENT DOCUMENTS

| | | | |
|---|---|---|---|
| 10,312,185 B2 * | 6/2019 | Bahr | H01L 23/5227 |
| 2008/0054428 A1 * | 3/2008 | Lam | H01L 23/645 257/686 |
| 2011/0050357 A1 * | 3/2011 | Kim | H01L 23/5227 333/32 |

* cited by examiner

*Primary Examiner* — Jeffrey M Shin
(74) *Attorney, Agent, or Firm* — Michael A. Davis, Jr.; Charles A. Brill; Frank D. Cimino

(57) ABSTRACT

An apparatus includes a microelectromechanical system (MEMS) die having a first surface and an opposing second surface. The MEMS die includes a surface-mounted resonator on the first surface and includes a first inductor. The apparatus also includes first and second dies. The first die has a third surface and an opposing fourth surface. The first die is coupled to the MEMS die such that the third surface of the first die faces the first surface of the MEMS die. The first and second surfaces are spaced apart. The first die includes an oscillator circuit and a second inductor. The oscillator circuit is coupled to the second inductor. The second inductor is inductively coupled to the first inductor. The second die is electrically coupled to the first die.

20 Claims, 4 Drawing Sheets

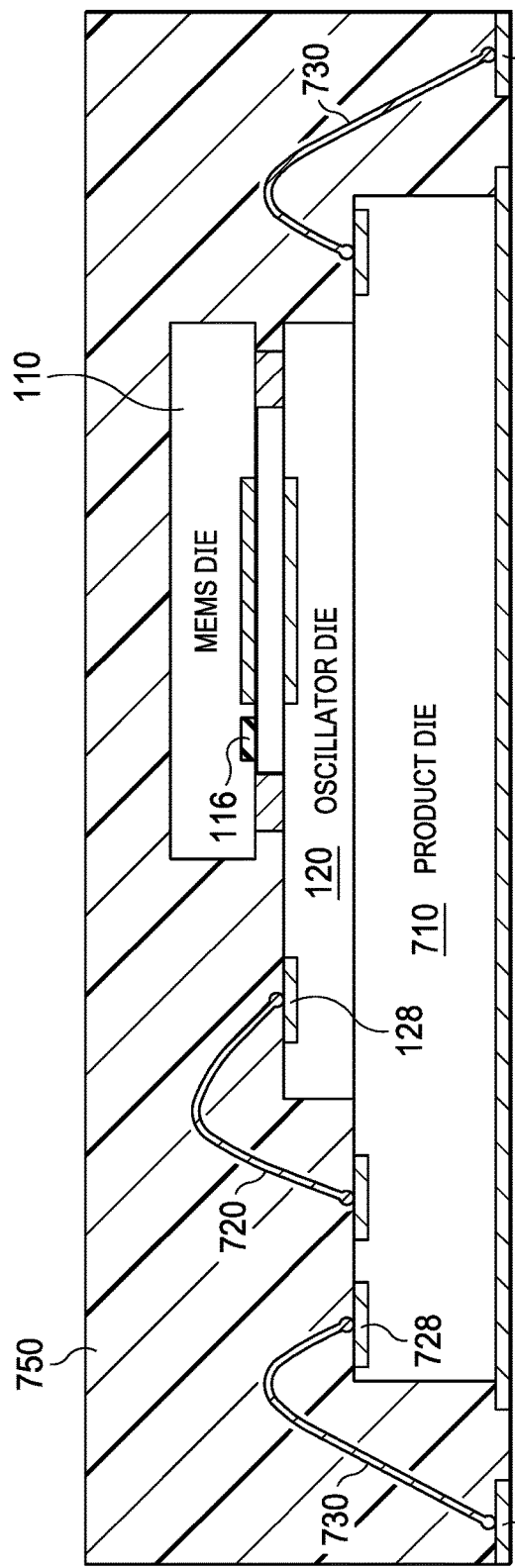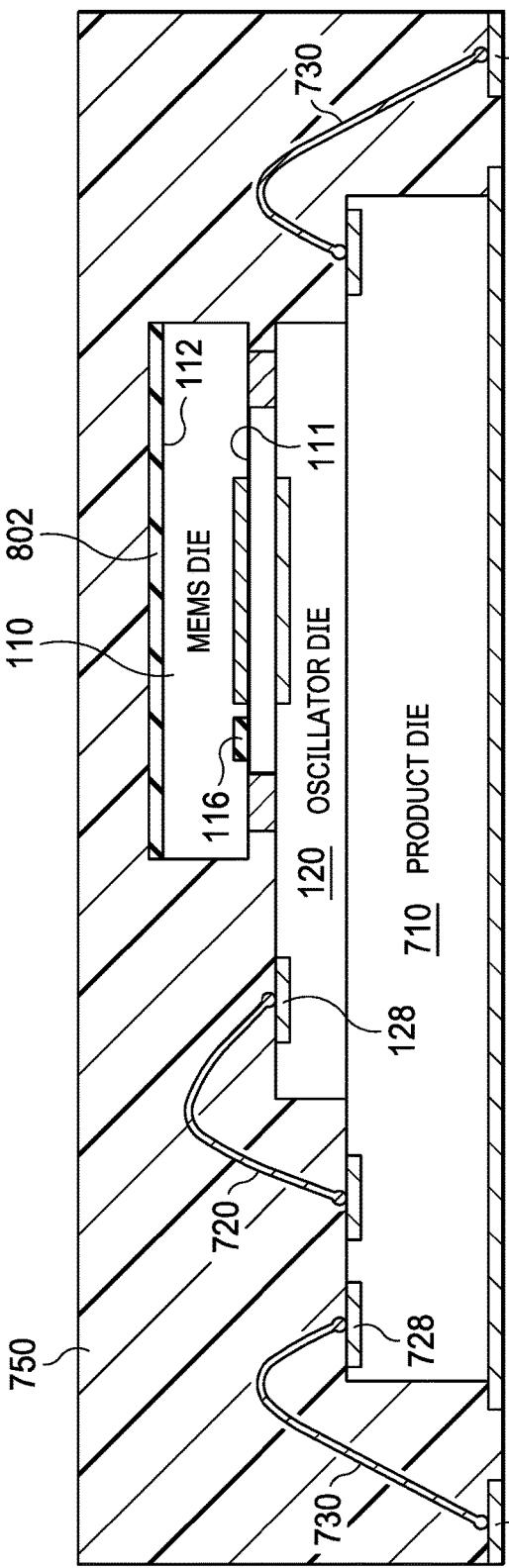

INDUCTIVELY-COUPLED MEMS RESONATORS

BACKGROUND

Timing devices are used as clock sources in a variety of modern electronic circuits. Such timing devices provide frequency control and timing for applications ranging from relatively simple crystal oscillators for mobile phones and radio transmitters to more complex timing devices for computers and navigational aids.

The industry standard for portable clock applications is quartz crystal tuned oscillators (XOs). The domination of XOs in the commercial market is a result of their good relative frequency accuracy, low frequency drift (or shift) as a function of temperature, and low noise. However, while the density of electronics has grown exponentially following Moore's law, the area and volume occupied by quartz crystals has not scaled accordingly.

To address the scaling issue for XOs, there have been efforts directed toward replacing the XOs with silicon microelectromechanical (MEMS)-based resonators (or oscillators) as the frequency source for clocks. MEMs resonators are effectively time-base generators, or timing references, similar in operating principle to a mechanical tuning fork.

One class of frequency reference components that has the potential to meet the above-described timing device needs is referred to as bulk acoustic wave (BAW) resonators. BAW resonators use the piezoelectric effect to convert electrical energy into mechanical energy resulting from an applied RF voltage and vice versa. BAW resonators generally operate at their mechanical resonant frequency which is defined as that frequency for which the half wavelength of sound waves propagating in the device, or multiples thereof, is approximately equal to the total piezoelectric layer thickness for a given velocity of sound for the material. BAW resonators operating in the GHz range generally have physical dimensions of tens of microns in diameter with thicknesses of a few microns.

SUMMARY

An apparatus includes a microelectromechanical system (MEMS) die having a first surface and an opposing second surface. The MEMS die includes a surface-mounted resonator on the first surface and includes a first inductor. The apparatus also includes first and second dies. The first die has a third surface and an opposing fourth surface. The first die is coupled to the MEMS die such that the third surface of the first die faces the first surface of the MEMS die. The first and second surfaces are spaced apart. The first die includes an oscillator circuit and a second inductor. The oscillator circuit is coupled to the second inductor. The second inductor is inductively coupled to the first inductor. The second die is electrically coupled to the first die.

BRIEF DESCRIPTION OF THE DRAWINGS

FIG. 7 shows an example of package containing a micro-oscillator device and a product die.

FIG. 8 shows another example of package containing a micro-oscillator device and a product die.

DETAILED DESCRIPTION

A microelectromechanical system (MEMS)-based oscillator comprises a MEMS-based resonator and an integrated circuit (IC). The IC and the MEMS resonator form a positive feedback system. The loop gain of this system is frequency dependent, and achieves a maxima at or very close to the resonance frequency of the MEMS resonator. The phase shift around the feedback loop is 0 at or very close to the same resonance frequency. The high gain and positive feedback cause existing noise to start growing into a sinusoidal waveform at a very specific frequency determined by the MEMS resonator. The non-linearity in the IC circuits limits the amplitude of the sinusoidal signal and prevents it from growing indefinitely. The performance of the MEMS resonator may be susceptible to mechanical and thermal stresses. The described examples provide adequate stress protection for the resonator. Further, due to the relatively high RF frequencies generated by the circuit that drives the resonator, special design care is required to optimize the performance of the MEMS-based oscillator. The circuit is specifically designed for a given semiconductor process technology. If the oscillator circuit is provided on a die with other circuitry and it is otherwise desirable to change the semiconductor process technology used to fabricate the die, then the oscillator circuit will also have to be re-designed and optimized for the new technology. The described examples avoid this problem as well.

The described examples generally are directed to a MEMS die attached to an oscillator die while providing a space between the facing surfaces of the two dies. A MEMS resonator is formed on the surface of the MEMS die that faces the oscillator die. The MEMS die also includes a first inductor. A second inductor is formed on the surface of the oscillator die facing the MEMS die. The inductors can be formed as part of the existing metallization stack for the CMOS or MEMS die, or can be deposited or attached as a post-processing step. The space between the facing surfaces prevents the oscillator die from touching and placing stress on the MEMS resonator. Various structures are described herein that seal the area between the two dies where the resonator is located. Accordingly, mold compound is not able to penetrate the space between the two dies. The first and second inductors are used to establish inductive coupling between the oscillator circuit and the MEMS resonator, thereby avoiding the use of conductive members such as copper pillars between the two dies (which otherwise might create stress on the MEMS resonator).

Figure 1:
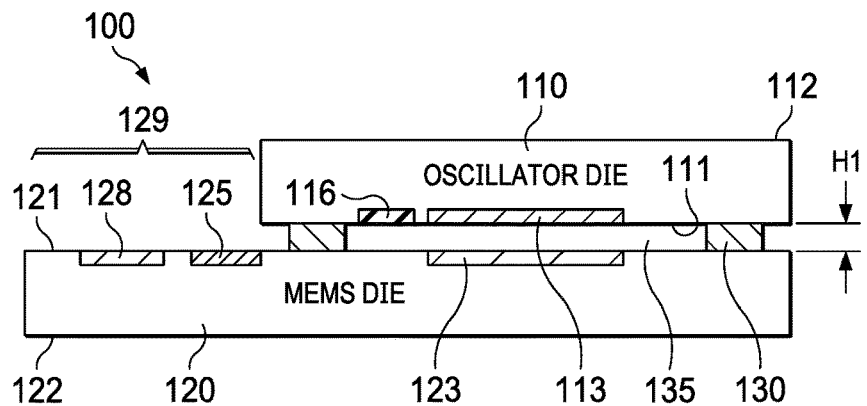
FIG. 1 illustrates a micro-oscillator structure comprising a MEMS die having a MEMS resonator and an oscillator die inductively coupled to the MEMS resonator die.

FIG. 1 shows an example of a "micro-oscillator" device 100 that includes a MEMS die 110 coupled to an oscillator die 120. The MEMS die 110 has opposing surfaces 111 and 112. The MEMS die 110 includes a surface-mounted resonator 116 and an inductor 113. The MEMS die may be constructed from a semiconductor material (e.g., silicon). The oscillator die 120 also may be constructed from a semiconductor material such as silicon and includes an oscillator circuit 125 and an inductor 123 formed as an integrated circuit on or within the oscillator die 120. The oscillator circuit 125 is inductively coupled to the resonator 116 via inductors 123 and 113. The oscillator circuit 125 generates an RF signal to be provided to the resonator via inductive coupling to thereby cause the resonator 116 to vibrate at its resonant frequency.

In the example of FIG. 1, the MEMS die 110 is coupled to the oscillator die 120 by way of an encapsulation frame 130. The encapsulation frame is disposed between the MEMS die 110 and the oscillator die 120. The encapsulation frame 130 functions to create a cavity 135 between the opposing surfaces 111 and 121 of the MEMS die 110 and oscillator die 120, respectively. By creating the cavity 135, the oscillator die 120 will not cause mechanical stress (such as stress that might results from an expansion or contraction due to a change in temperature) on the resonator 116. In some examples, the height of the cavity 135 (i.e., the distance between facing surfaces 111 and 121) is in the range of 0.5 micrometer to 50 micrometers. In some implementations, the cavity 135 comprises a vacuum. The encapsulation frame 130 also seals the cavity 135 between the two die to prevent mold compound from entering the cavity and contacting the resonator 116 (which otherwise might result in changes in stress of the resonator 116 from thermal changes). In some examples, the encapsulation frame 130 has satisfactory adhesion to both the MEMS and oscillator dies, while having a relatively low thermal expansion coefficient to prevent the generation of stresses which could significantly affect the MEMS resonator. The encapsulation frame 130 may be fabricated from a variety of materials such as passivation material (e.g., Polyimide, Silicon Nitride, etc.).

In some examples, the encapsulation frame 130 is formed as follows. A passivation layer is deposited across the surface 111 of the MEMS die 110 (e.g., across a wafer containing multiple partially-formed MEMS dies 110). A cavity 135 is then etched in the passivation layer down to the silicon surface 111 of the MEMS die 110. The resonator 116 and inductor 113 are then formed within the cavity 135. The oscillator die 120 is then bonded to the MEMS die 110 via the resulting encapsulation frame formed within the previously deposited passivation layer.

As shown in FIG. 1, the oscillator die 120 is larger than the MEMS die 110. For example, the surface area of the oscillator die 120 is larger than the surface area of the MEMS die 110 and thus a portion 129 of the surface 121 of the oscillator die 120 is not covered by the MEMS die 110. One or more bond pads 128 are provided on the exposed surface 121 of the oscillator die 120 to permit, for example, bond wires to be attached during packaging, as described below.

Figure 2:
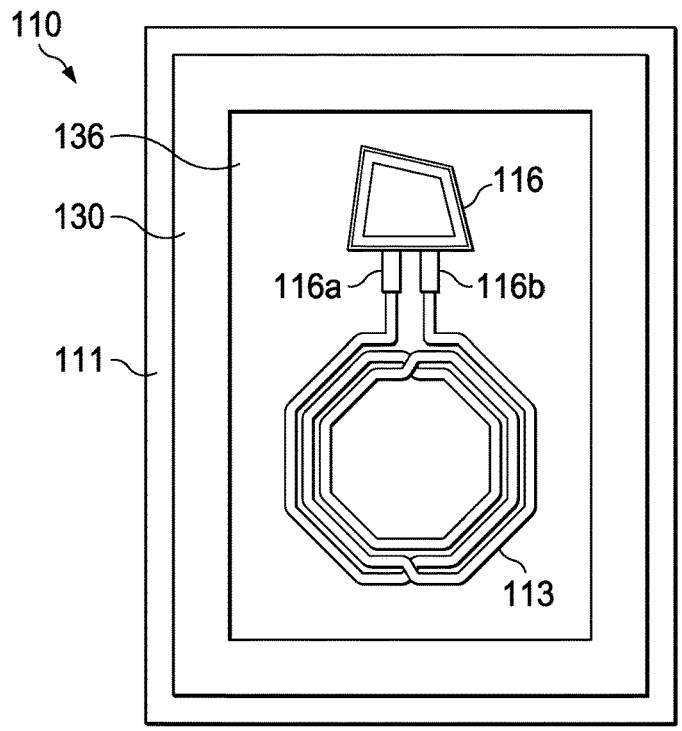
FIG. 2 shows a view of a surface of the MEMS including the MEMS resonator and an inductor.

FIG. 2 shows a top-down view of surface 111 of the MEMS die 110. An example structure for the inductor 113 and resonator 116 are shown. The inductor 113 comprises one or more loops of conductive material and is electrically coupled to terminals 116a and 116b of the resonator 116. The encapsulation frame 130 is shown encircling the inductor 113 and resonator 116 structures. The peripheral shape of the encapsulation frame 130 can be rectangular as shown and be rectangular in cross-section as well, or can have other shapes (rectangular with rounded corners, oval, circular, non-geometric shapes, etc.). The encapsulation frame 130 defines an interior area 136 in which the inductor 113 and resonator 116 of the MEMS die 110 and the inductor 123 of the oscillator die 120 reside. The inductors 113, 123 are fabricated on their respective dies such that when the two dies are positioned as shown in FIG. 1, the inductors face one another to transfer sufficient energy through inductive coupling.

Figure 3:
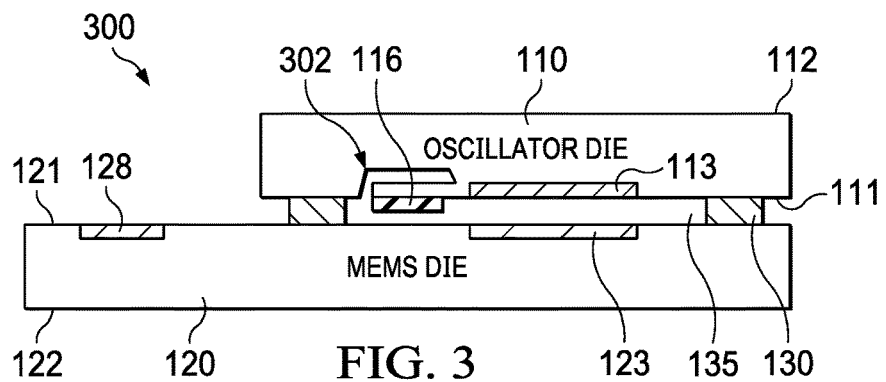
FIG. 3 illustrates another example of a micro-oscillator structure in which a cavity is formed within the MEMS die to further protect the resonator.

FIG. 3 shows an example of a micro-oscillator device 300 which is similar to that shown in FIG. 1. In FIG. 3, a cavity 302 is formed in the surface 111 of the MEMS die 110 and the resonator 116 covers at least a portion of the cavity 302. The resonator thus has a cavity 302 on one side and another cavity 135 on the other side, and mechanical stress to the resonator 116 is further reduced with this structure.

Figure 4:
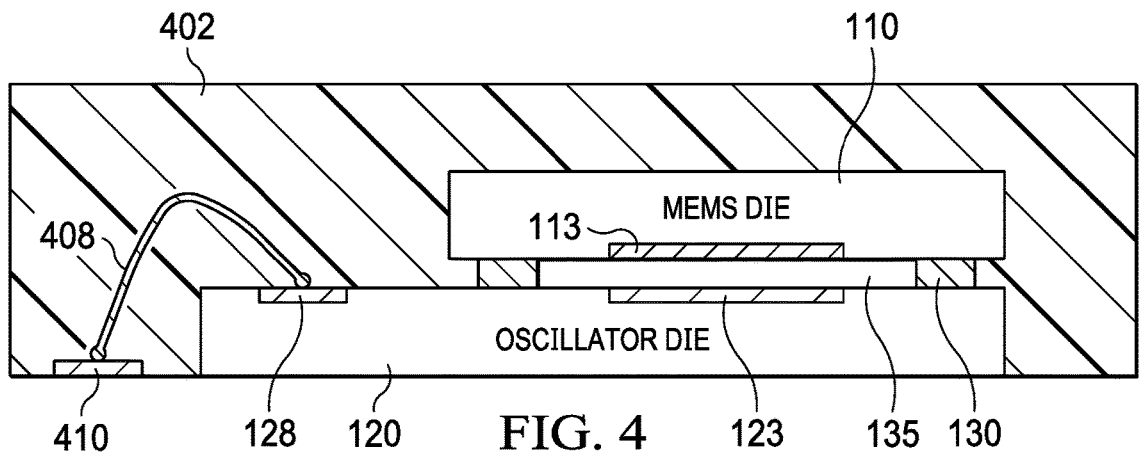
FIG. 4 shows an example of a package for the micro-oscillator structure.

The micro-oscillator device (such as micro-oscillator devices 100, 300) can be packaged as a stand-alone device. In FIG. 4, the combination of the MEMS die 110, oscillator die 120 and encapsulation frame therebetween is encapsulated in mold compound 402 in the form a quad-flat no-leads (QFN) package. As explained above, the encapsulation frame 130 the opposing surfaces 113 and 123 of the two dies prevents mold compound 402 from entering the cavity 135. A bond wire 408 is shown connecting the bond pad of the oscillator die 120 to a bond pad 410 of the resulting package. One or more additional pairs of bond pads of the oscillator die 120 and the package also can be connected via bond wires. Due to the cavity 135, the resonator 116 (shown in FIGS. 1-3) on surface 113 of the MEMS die 110 is protected from thermal expansion or contraction of the mold compound and/or oscillator die 120, thereby reducing or avoiding mechanical stress on the resonator.

Figure 5:
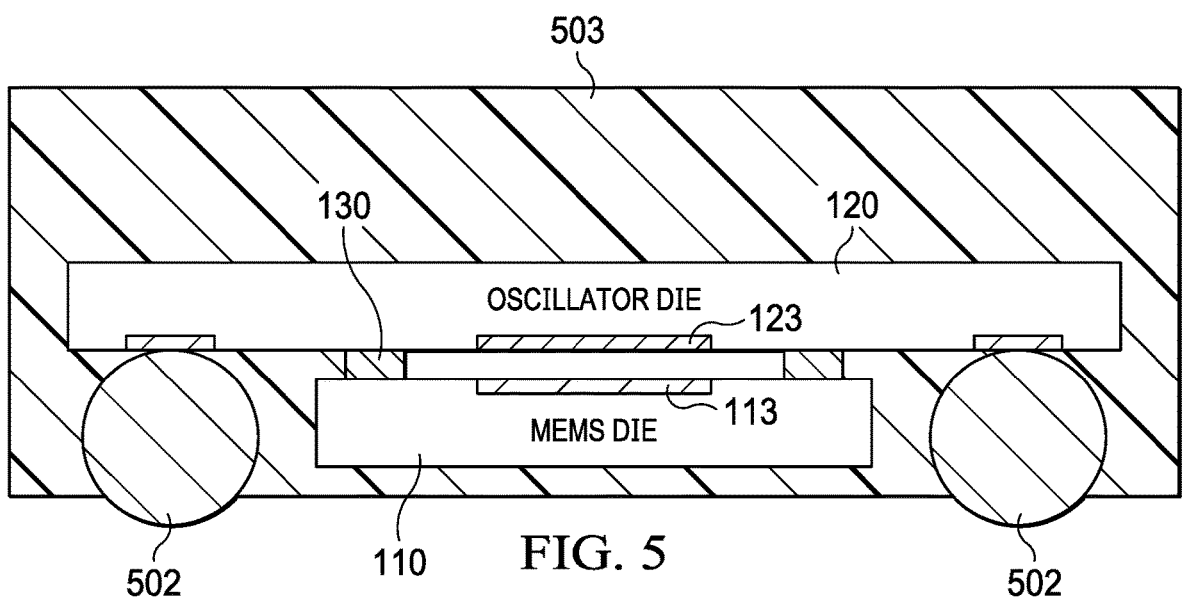
FIG. 5 shows another example of a package for the micro-oscillator structure.

FIG. 5 provides a packaging example of the micro-oscillator device in the form of a flip-chip package with solder bumps 502. Mold compound 503 encapsulate the micro-oscillator device as shown and the resulting package can be attached to a circuit board or another semiconductor die via the solder bumps. In another example of the structure of FIG. 5, the structure is the same as shown in FIG. 5 but without the mold compound 503. The resulting combination of dies 110, 120 can then be soldered to a printed circuit board (PCB) as bare silicon (waver level chip scale package).

Figure 6:
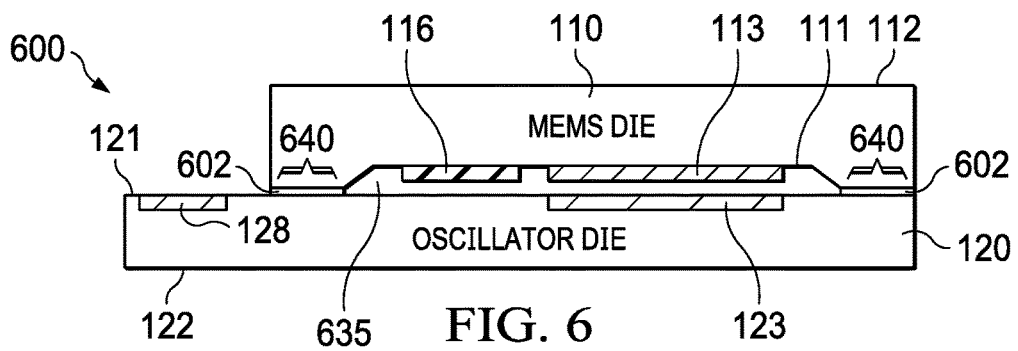
FIG. 6 shows another example of a micro-oscillator structure in which the MEMS die is attached directly to the oscillator die.

FIG. 6 shows an example of a micro-oscillator device 600 in which the MEMS die 110 is attached directly to the oscillator die, and thus without the use of an encapsulation frame 130. Instead, a shallow cavity 635 (e.g., 10 micrometers deep) is etched in the MEMS die as shown. The resonator 116 and inductor 113 are then formed within the cavity as shown, and the MEMS die 110 is then bonded to the oscillator 120 using an adhesive or other type of material to attach the two dies together. The cavity 635 is defined by an outer edge 640 of surface 111. The outer edge 640 of surface 111 is adhered to surface 121 of the oscillator die 120 as shown.

FIG. 7 shows an example in which the micro-oscillator device comprising the MEMS die 110 and the oscillator die 120 are packaged along with a "product" die 710. In this example, the oscillator die 120 is adhered to the product die 710 and the MEMS die 110 is on a side of the oscillator die 120 opposite the product die 710. Mold compound 750 encapsulate all three dies as shown. The product die 710 includes any suitable integrated circuit. Examples include a processor, a communication circuit, an analog-to-digital converter (ADC), etc. An electrical interface is implemented between the circuit on the product die 710 and the oscillator circuit on the oscillator die 120. As explained above, the MEMS die 110 is inductively coupled to the oscillator die 120. One or more bond wires 720 electrically connect the oscillator die to the product die 710, and one or more bond wires 730 connect bond pads 728 on the product die 710 to externally-accessible bond pads 732. With this approach, the oscillator circuit and oscillator die 120 can be implemented and optimized in a different CMOS process than the product die 710. The same CMOS oscillator die 120 can be used for different product dies 710, regardless of their individual implementation, which allows for separate performance and cost optimization of both oscillator die 120 and produce die 710.

Figure 9:
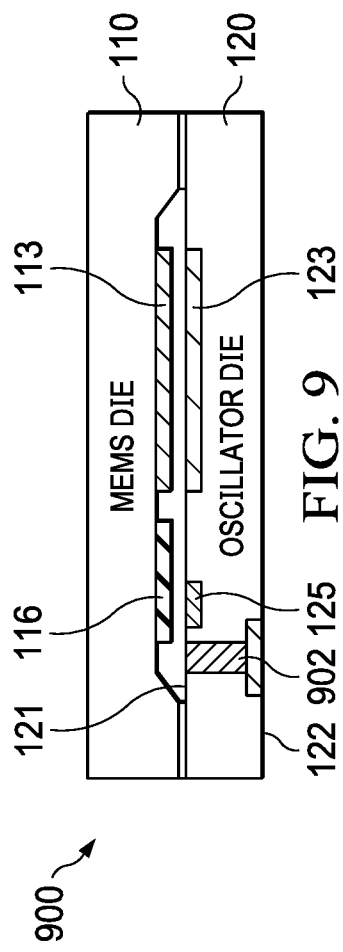
FIG. 9 shows an example of a micro-oscillator device including through silicon vias (TSV) in the oscillator die.

FIG. 8 shows a structure similar to that of FIG. 7. The difference in FIG. 8 is that a material 802 is included on the surface 112 of the MEMS die 110, and thus between the MEMS die 110 and the mold compound 750. The material 802 provides additional stress release to the resonator 116. In some implementations, the material 802 is "soft." In one example, material 802 has a Young's Modulus less than 100 MPa. Examples of such material include Polydimethylsiloxane (PDMS) and parylene, FIG. 9 shows an example of a micro-oscillator device 900 in which the surface area of the MEMS die 110 is approximately the same as the surface area of the oscillator die. Whereas a portion of the oscillator die 120 was exposed in the example of FIG. 1 and a bond pad was located on the exposed oscillator die 120, the oscillator die 120 in FIG. 9 includes one or more through-silicon-vias (TSV) 902 to provide electrical connectivity between the oscillator circuit 125 and a product die, or other electrical device. In the example of FIG. 9, the TSV 902 extends between the opposing surfaces 121 and 122 of the oscillator die and may be coated or filled with a conductive material (e.g., copper, gold, etc.).

The dies 110 and 120 have approximately the same surface area and shape, which permits dies 110, 120 to be attached to each other as a wafer-level process. Accordingly, a wafer containing multiple MEMS dies 110 can be bonded to a wafer containing a corresponding number of oscillator dies 120. After the two wafers are attached to each other, the individual micro-oscillator devices 900 can be produced by dicing the wafer set.

Figure 10:
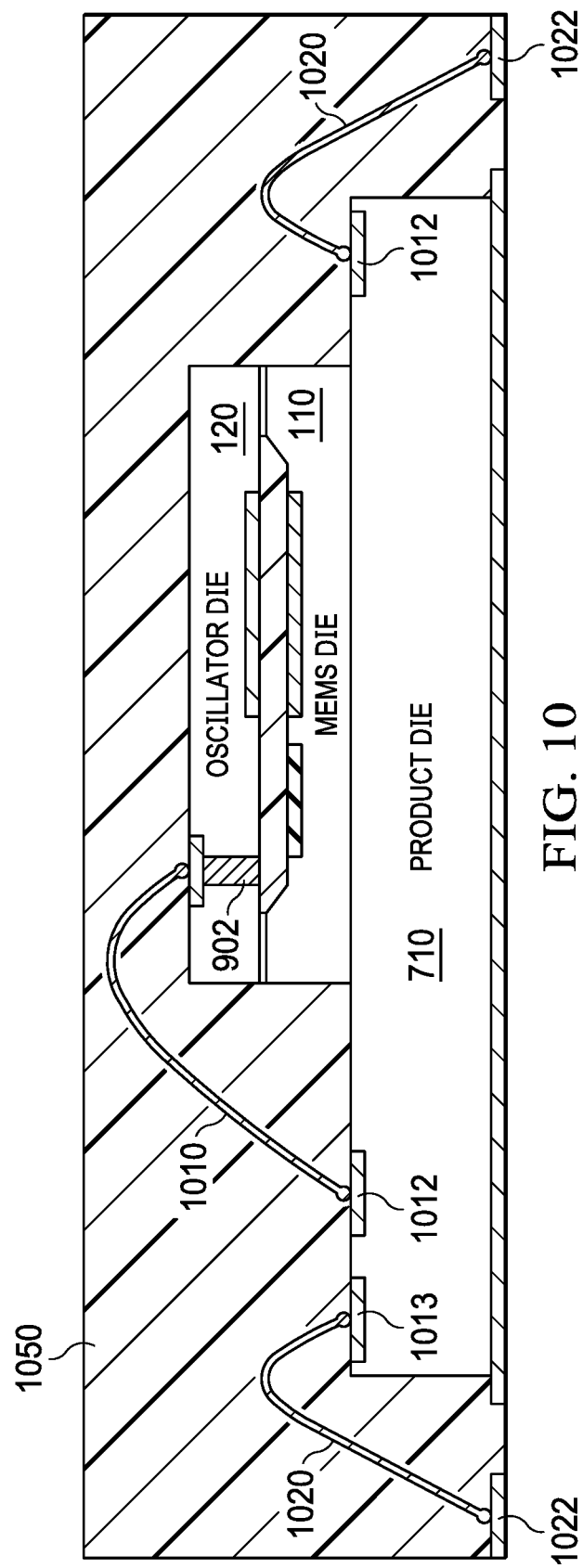
FIG. 10 shows another example of package containing a micro-oscillator device and a product die, in which TSV vias are provided in the oscillator die.

FIG. 10 illustrates a package containing the structure of FIG. 9 attached to a product die 710. Mold compound 1050 encapsulates the dies as shown. In this example, the MEMS die 110 is sandwiched between the oscillator die 120 and the product die 710. The MEMS die 110 is inductively coupled to the oscillator die's oscillator circuit. One or more bond wires 1010 electrically connect the TSV 902 to bond pads 1012 on the product die 710. Bond wires 1020 electrically connect other bond pads 1013 on the product die 710 to externally-accessible bond pads 1022.

The examples above include a micro-oscillator device that can be packaged by itself (e.g., FIGS. 4 and 5) or with another die (e.g., FIGS. 7, 8, and 10). The resonator of the MEMS die is protected from stresses by way of a cavity between the MEMS die and the oscillator die. The MEMS die and the oscillator die (and any materials or structures mechanically coupling the two dies together) prevent the intrusion of mold compound into the cavity and provide protection for the resonator. The oscillator circuit on the oscillator die is inductively coupled to the resonator and thus no rigid electrically conductive members (e.g., copper pillars) are needed (which otherwise would contribute to stress problems for the resonator).

Modifications are possible in the described embodiments, and other embodiments are possible, within the scope of the claims.

What is claimed is:

1. An apparatus, comprising:
   a microelectromechanical system (MEMS) die having a first surface and an opposing second surface, the MEMS die including a surface-mounted resonator on the first surface and including a first inductor;
   a first die having a third surface and an opposing fourth surface, the first die coupled to the MEMS die, the third surface facing the first surface, the first and third surfaces being spaced apart, the first die including an oscillator circuit and a second inductor, the oscillator circuit coupled to the second inductor, and the second inductor adapted to be inductively coupled to the first inductor; and
   a second die electrically coupled to the first die.

2. The apparatus of claim 1, further comprising a mold compound encapsulating at least a portion of the first, second and MEMS dies.

3. The apparatus of claim 2, further comprising a material on the second surface, in which the material is between the second surface and the mold compound, and the material has a Young's Modulus less than 100 MPa.

4. The apparatus of claim 1, wherein the MEMS die includes a cavity in the first surface, and the surface-mounted resonator covers at least a portion of the cavity.

5. The apparatus of claim 1, wherein the MEMS die includes a cavity in the first surface defined by an outer edge thereof, and the outer edge of the first surface is adhered to the third surface of the first die.

6. The apparatus of claim 1, further comprising an encapsulation frame between the first die and the MEMS die, the encapsulation frame defining an interior area, wherein the first inductor, the second inductor and the surface-mounted resonator are within the interior area.

7. The apparatus of claim 1, further comprising an encapsulation frame between the first die and the MEMS die, the encapsulation frame defining an interior area, and the surface-mounted resonator being within the interior area.

8. The apparatus of claim 7, wherein the encapsulation frame includes a passivation material.

9. The apparatus of claim 1, wherein a surface area of the first die is larger than a surface area of the MEMS die, and the third surface includes a bond pad to which a bond wire is adhered.

10. The apparatus of claim 1, wherein a surface area of the first die is the same as a surface area of the MEMS die, the first die includes a through-silicon-via (TSV) between the third and fourth surfaces, and the TSV electrically connects the second die to the oscillator circuit.

11. The apparatus of claim 1, wherein the second die is adhered to the fourth surface of the first die.

12. The apparatus of claim 1, further comprising solder bumps coupling the third surface of the first die to the second die, wherein the MEMS die is between the third surface and the second die.

13. An apparatus, comprising:
   a microelectromechanical system (MEMS) die having a first surface and an opposing second surface, the MEMS die including a surface-mounted resonator on the first surface and including a first inductor;
   a first die having a third surface and an opposing fourth surface, the first die coupled to the MEMS die, the third surface facing the first surface, the first and third surfaces being spaced apart, the first die including an oscillator circuit and a second inductor, the oscillator circuit coupled to the second inductor, and the second inductor adapted to be inductively coupled to the first inductor; and a mold compound encapsulating at least a portion of the first and MEMS dies.

14. The apparatus of claim 13, wherein the MEMS die includes a cavity in the first surface, and the surface-mounted resonator covers at least a portion of the cavity.

15. The apparatus of claim 13, wherein the MEMS die includes a cavity in the first surface defined by an outer edge thereof, and the outer edge of the first surface is adhered to the third surface of the first die.

16. The apparatus of claim 13, further comprising an encapsulation frame between the first die and the MEMS die, the encapsulation frame defining an interior area, and the first and second inductors being within the interior area.

17. The apparatus of claim 13, wherein a surface area of the first die is larger than a surface area of the MEMS die, and the third surface includes a bond pad to which a bond wire is adhered.

18. The apparatus of claim 13, wherein a surface area of the first die is the same as a surface area of the MEMS die, and the first die includes a through-silicon-via (TSV) between the third and fourth surfaces.

19. The apparatus of claim 13, further comprising a second die, wherein the mold compound encapsulates at least a portion of the second die, and the second die is adhered to the fourth surface of the first die.

20. The apparatus of claim 13, further comprising:
a second die, wherein the mold compound encapsulates at least a portion of the second die; and
solder bumps coupling the third surface of the first die to the second die, wherein the MEMS die is between the third surface and the second die.

* * * * *